United States Patent
Bains (10) Patent No.: US 8,738,993 B2
(45) Date of Patent: May 27, 2014

(54) MEMORY DEVICE ON THE FLY CRC MODE

(75) Inventor: Kuljit S. Bains, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 390 days.

(21) Appl. No.: 12/978,014

(22) Filed: Dec. 23, 2010

(65) Prior Publication Data

US 2012/0144264 A1   Jun. 7, 2012

Related U.S. Application Data

(60) Provisional application No. 61/420,270, filed on Dec. 6, 2010.

(51) Int. Cl.
*G11C 29/00* (2006.01)

(52) U.S. Cl.
USPC .......................................................... 714/763

(58) Field of Classification Search
USPC ........................................ 714/763, 800, 807
See application file for complete search history.

(56) References Cited

U.S. PATENT DOCUMENTS

| | | | | | |
|---|---|---|---|---|---|
| 4,758,992 | A | * | 7/1988 | Taguchi | 365/222 |
| 7,461,320 | B2 | * | 12/2008 | Klein | 714/754 |
| 7,617,437 | B2 | * | 11/2009 | Moyer | 714/763 |
| 7,650,558 | B2 | * | 1/2010 | Rosenbluth et al. | 714/766 |
| 7,734,985 | B2 | * | 6/2010 | Bains | 714/763 |
| 7,840,876 | B2 | * | 11/2010 | Sturm et al. | 714/766 |
| 2007/0011562 | A1 | | 1/2007 | Alexander et al. | |
| 2007/0271490 | A1 | * | 11/2007 | Aldereguia et al. | 714/746 |
| 2009/0132888 | A1 | | 5/2009 | Bains et al. | |
| 2009/0175102 | A1 | * | 7/2009 | Nin et al. | 365/193 |
| 2011/0113204 | A1 | * | 5/2011 | Henriksson et al. | 711/154 |
| 2012/0198310 | A1 | * | 8/2012 | Tran et al. | 714/763 |

OTHER PUBLICATIONS

International Search Report and Written Opinion from PCT/US2011/062315 mailed Jun. 1, 2012, 12 pages.
International Preliminary Report on Patentability and Written Opinion from PCT/US2011/062315 mailed Jun. 20, 2013, 9 pages.

* cited by examiner

*Primary Examiner* — Philip Guyton
(74) *Attorney, Agent, or Firm* — Blakely, Sokoloff, Taylor & Zafman LLP (57) ABSTRACT

On the fly enabling and disabling of error detection for memory access transactions on a transaction basis is provided. Dynamic enabling and disabling of error detection for memory access transactions can also be applied for multiple transactions. Control logic associated with the memory device determines whether to apply error detection, and selectively enables error detection in the memory access transaction. The selective enabling of error detection in a memory access transaction can apply to either reads or writes.

27 Claims, 6 Drawing Sheets

MEMORY DEVICE ON THE FLY CRC MODE

RELATED CASES

This application claims the benefit of priority of U.S. Provisional Patent Application No. 61/420,270, filed Dec. 6, 2010.

FIELD

Embodiments of the invention are generally related to memory devices, and more particularly to dynamically enabling and disabling memory access error checking on the fly.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright© 2010, Intel Corporation, All Rights Reserved.

BACKGROUND

Memory devices find ubiquitous use in computing devices. Dynamic random access memory (DRAM) is commonly used as working memory in computing devices. The working memory is often volatile (it loses state if power is interrupted to the system), and provides temporary storage for data and programs (code) to be accessed and executed by the system processor(s).

Memory device access for main system memory in a computing device does not traditionally include the use of cyclic redundancy checking (CRC). There is known use of CRC with graphics controllers; however, the use of CRC in graphics controllers is performed with a separate pin in the hardware devices. Use of a mode register allows the setting of a CRC mode, but is a process that involves several operations, which introduces a certain amount of overhead. The overhead may be considered acceptable for setting the CRC in an initialization routine. However, the overhead provides a delay that could be significant outside of an initialization or setup operation.

Figure 1:
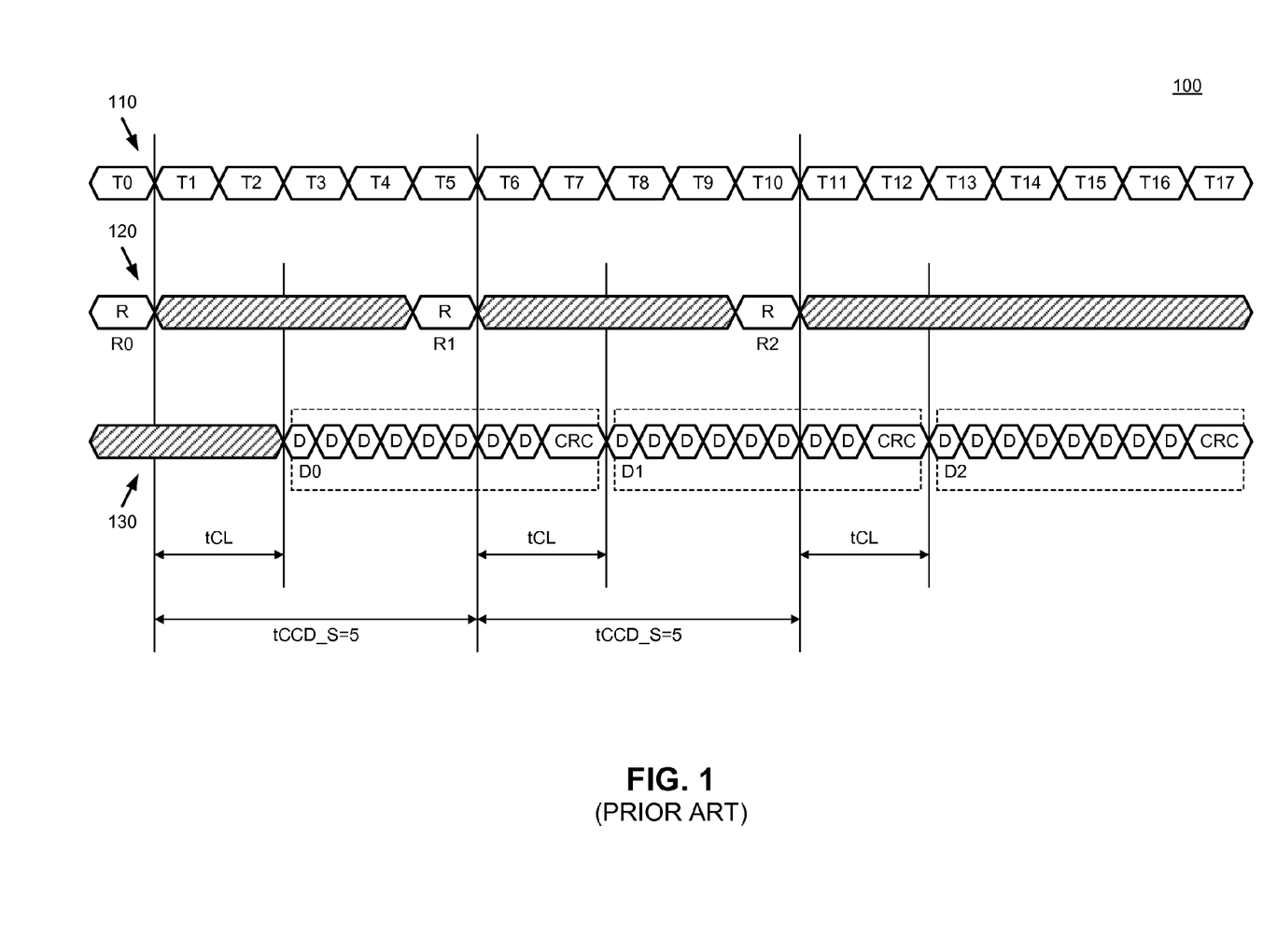
FIG. 1 is a timing diagram of prior art memory access error detection.

FIG. 1 is a timing diagram of prior art memory access error detection. As seen in diagram 100, back-to-back reads with CRC enabled are performed. Clock signal 110 provides a timing reference for the occurrence of the various activities. There are eighteen clock cycles shown, T0-T17. Command line 120 illustrates when read commands occur in the example. The discussion of diagram 100 is only made in reference to the read commands, thus, except for the read commands the rest of the command signal is filled with "Don't Care" hash marking.

Three back-to-back reads are shown, R0, R1, and R2. There is a delay of tCL between the issuance of the read command, and the start of the transfer of data (D) on data signal 130. For purposes of illustration, data transfers D0, D1, and D2 are blocked in dashed lines to show what part of data signal 130 corresponds with which command (R0, R1, and R2 respectively). Back-to-back reads to different bank groups are assumed to take 5 clocks or 5 clock cycles (tCCD_S=5).

There are two data transfers (D) per clock. Each data transfer takes 10 UI (unit intervals, or 5 clocks, with 2 UIs per clock). It will be observed that the CRC signal occupies 2 UI for each data transfer.

The lack of CRC means that certain errors introduced into data access operations may negatively affect the data read. However, the use of CRC can have a negative impact on memory access performance.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Descriptions of certain details and implementations follow, including a description of the figures, which may depict some or all of the embodiments described below, as well as discussing other potential embodiments or implementations of the inventive concepts presented herein. An overview of embodiments of the invention is provided below, followed by a more detailed description with reference to the drawings.

DETAILED DESCRIPTION

As provided herein, access to a memory device can be performed with or without error detection, and the enabling or disabling of error detection is performed on the fly on a transaction by transaction basis. Dynamic enabling and disabling of error detection for memory access transactions can also be applied in one embodiment for multiple transactions. Control logic associated with the memory device determines whether to apply error detection, and selectively enables error detection in the memory access transaction. The selective enabling of error detection in a memory access transaction can apply to either reads or writes. The switching between error detection enabled and disabled does not require a change of a mode register. In one embodiment, as described in more detail below, switching between error detection enabled and disabled can be performed via a mode register for an actively operating memory (i.e., not leaving the mode register setting fixed after initialization of the system).

The dynamic switching of states (enabled and disabled) of an error detection mode allows a system to use error detection to prevent a negative impact of erroneous transactions, while at the same time allowing the system to not use error detection to avoid memory access performance costs. Thus, the system can benefit from the use of error detection in situations where the performance impact is outweighed by the need for error detection. The system can also avoid the performance impact in situations where error detection is less significant.

An implementation of a memory subsystem typically includes memory resources that store data, and an associated memory controller, which controls access to the memory resources. As described herein, the memory controller may also manage the use of a CRC (cyclic redundancy check) for memory accesses. More particularly, the memory controller can enable dynamic use of CRC.

In one embodiment, the memory device is a DRAM compatible with DDR (dual data rate) standards. Reference below is made to a DRAM as an example, which is to be understood as an example of any memory device according to any embodiment described herein that supports on the fly error detection for memory access.

Certain memory implementations, such as those supporting DDR version 4 (DDR4), may implement error detection in memory device access. Reference herein to error detection refers to any mechanism that allows a memory and controller pair or memory and processor pair to check for errors in the data of the memory access transaction. Applying error detection adds data transfer overhead to the memory access transaction. In particular, error detection includes the use of an error check value. Cyclic redundancy checking (CRC) refers to error detection with the use of a checksum. As used herein, error detection includes CRC or any other form of error detection with an error check value.

In contrast to the dynamic enabling of error detection mode as described herein, one implementation of error detection would be the use of error detection on all data accesses. The error detection data (i.e., the error check value) would thus add overhead to each data access. In contrast, in one embodiment, inline error detection enabling/disabling would be implemented with an inline command instead of implemented by default on all data access. Thus, error detection can be enabled per transaction via inline command.

In one embodiment, inline error detection is implemented for DDR4 using a 10 UI (unit interval) frame format, where a unit interval is an interval of the clock. DDR4, for example, has two UIs per clock cycle (e.g., a rising and a falling edge). The error check value (e.g., a CRC checksum) is appended to end of an 8 UI data transfer, as illustrated in the table below.

The 10 UI frame format may be useful to save on DRAM, connector, and controller pins, because the data signal is used to transmit the error detection information, rather than using pins for control or error detection. The downside of the 10 UI frame format is that it results in significant bandwidth loss for streaming data. The loss in peak bandwidth is estimated to be around 20%, and loss in utilized bandwidth for memory intensive applications is estimated to be in the range of 5% based on simulations.

By enabling error detection to be dynamically turned on and off as described herein, the performance impact of error detection can be controlled. More particularly, in one embodiment, error detection is enabled only for certain data types and disabled for others. For example, graphics display data does not necessarily require error detection, because the loss of a few pixels due to data corruption is generally negligible in a display, and the displays are updated frequently relative to the risk of memory access corruption. Thus, the potential loss of pixel data is generally minimal on user experience.

Similarly, media data may be less subject to noticeable delay due to data corruption on memory accesses, and error detection can be disabled for that data type. Additionally, error detection can be considered less critical for access that is expected to be back-to-back (e.g., streaming data). However, system data, critical application data, or data access related to servers can be considered more significant to verify for corruption, and error detection can be enabled.

In one embodiment, the processor issuing a memory request knows what type of data it is requesting. Thus, the data type can be indicated to the memory controller, which can then appropriately turn error detection on or off, depending on the data type.

DDR4 allows independent enabling of Read and Write error detection using mode register bits. If error detection is enabled then the frame length is 10 UI and if error detection is disabled then the frame length is 8 UI. If error detection mode is changed using a mode register, then it would take several clocks to do so due to mode register programming overhead. On the fly error detection command encoding as described herein allows the memory controller to use error detection on a transaction by transaction basis. Thus, error detection switching (enabling and disabling) can occur per command, which is not possible by use of a mode register. In one embodiment, a mode register bit is defined to enable

| | TRANSFER | | | | | | | | | |
|---|---|---|---|---|---|---|---|---|---|---|
| | 0 | 1 | 2 | 3 | 4 | 5 | 6 | 7 | 8 | 9 |
| DQ0 | BYTE 0 | BYTE 1 | BYTE 2 | BYTE 3 | BYTE 4 | BYTE 5 | BYTE 6 | BYTE 7 | CRC 0 | 1 |
| DQ1 | 0 | 1 | 2 | 3 | 4 | 5 | 6 | 7 | CRC 1 | 1 |
| DQ2 | | | | | | | | | CRC 2 | 1 |
| DQ3 | | | | | | | | | CRC 3 | 1 |
| DQ4 | | | | | | | | | CRC 4 | 1 |
| DQ5 | | | | | | | | | CRC 5 | 1 |
| DQ6 | | | | | | | | | CRC 6 | 1 |
| DQ7 | | | | | | | | | CRC 7 | 1 |

The above table is an illustration of an example of a CRC data frame for an x8 device. 64 bits of data are transferred per read or write transaction over the first 8 UIs (UI 0-7) and an 8-bit CRC checksum is transferred in UI 8. In one embodiment, UI 9 is used for x4 devices, and not used for x8 devices; thus, UI 9 is driven to all '1's for the x8 case.

'error detection on the fly', and the issuance of a switching command controls whether error detection switching occurs.

It will be understood that memory access typically involves the issuing of a RAS (row access select (or strobe)) signal to open a page of data, and CAS (column access select (or strobe)) signal to access a particular column to read the data. In one embodiment, such as with access in a streaming context or other data affinity context, there may be multiple CAS signals associated with one RAS signal. In other implementations, there is a one-to-one relationship between RAS and CAS commands.

It will also be understood that there are typically more rows of data than columns. Thus, the number of bits required to implement a CAS command may be fewer than the number required for a RAS command. Thus, in one embodiment, one or more bits of the CAS command are used to implement error detection on the fly. For example, if a Read or Write CAS command is issued with bit A12=1, then the frame length may be 10 UI (use error detection), whereas a Read or Write CAS command with bit A12=0 may have a frame length of 8 UI (no error detection). Alternative bits could be used. Alternatively, another command signal could be issued with the CAS command to indicate whether error detection should be used or not.

As mentioned above, error detection may be selectively enabled or disabled through setting a mode register that controls support of a memory device for error detection. While use of a mode register may not enable changing of error detection on back-to-back transactions, the ability to switch error detection on and off for periods of time can be useful. As before, switching error detection on and off could be done for both read and write transactions, and may be done per mode register, and thus for any one or more memory devices controlled by the selected mode register.

In one embodiment, the mode register can be set by the memory controller or another controller in the system (e.g., an adjunct processor or other controller that manages operation of the system). The mode register can be set by toggling one or more bits of the mode register to change from enabling to disabling error detection, or vice versa. Thus, during active operation of a memory device (e.g., not during initialization), the mode register can be changed, and thus change application of error detection for memory access transactions.

Error detection may be selectively enabled by the mode register, for example, for a series of transactions. As another example, in a multi-core or multi-processor system, certain processors may perform operations for which error detection is desired, while it is not considered necessary for operations by other processors. Thus, the system could be configured for cache affinity, and apply error detection for certain processors and not others, or for certain applications and not others. Mode register error detection switching can thus apply for bursts of requests from a common source. Alternatively, there may be times of day where error detection is significantly more burdensome than others, and error detection can be appropriately switched on or off according to times of heavier traffic (i.e., heavier access to a memory device), while not needing to be switched on or off per transaction.

In one embodiment, the determination of whether to apply error detection is made internally to the system. Thus, the memory controller or other controller determines via timer, historical records (in the example of turning on and off for times of day), by memory access monitoring, by detecting the source of access requests, or other mechanisms. In one embodiment, the determination of whether to apply error detection is made externally to the memory subsystem, such as by request from a remote system or remote administrator. Thus, an administrator can request that error detection be turned on or off.

Figure 2:
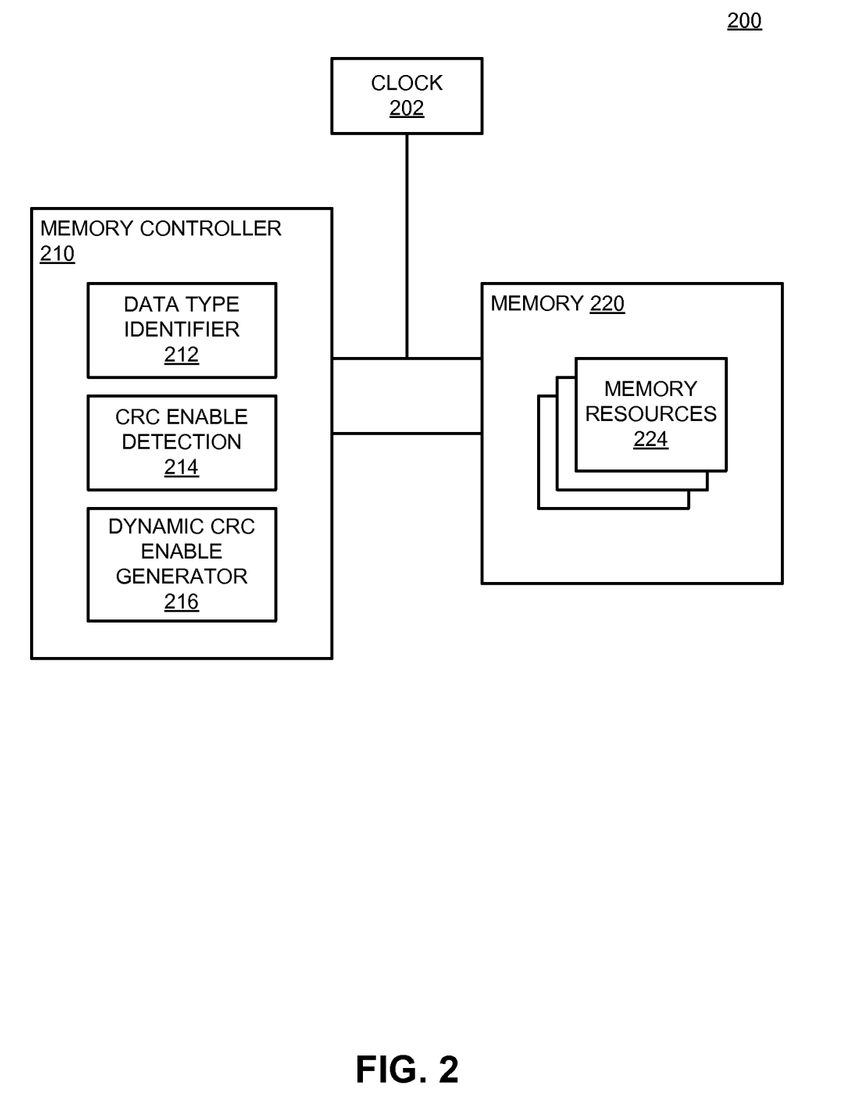
FIG. 2 is a block diagram of an embodiment of a system with a memory device that has on the fly memory access error detection based on controls from a memory controller.

FIG. 2 is a block diagram of an embodiment of a system with a memory device that has on the fly memory access error detection based on controls from a memory controller. System 200 represents any of a number of computing devices that may include a memory device with dynamic refresh rate switching. Such computing devices may include servers, desktops, laptops, mobile devices, smartphones, gaming devices, and others. System 200 includes memory 220, which is a memory device according to any embodiment described herein and includes one or more memory resources 224, which represent the resources on which the data is stored for memory 220.

Memory controller 210 includes standard logic (hardware and/or software) to control access to memory 220 as is understood in the art. Memory controller 210 is associated with memory 220 because it controls access to memory 220. In one embodiment, memory controller 210 includes functionality (e.g., features implemented by logic of memory controller 210) data type identifier 212, CRC enable detection 214, and dynamic CRC enable generator 216. The illustrated functionality is not intended to represent all functionality of memory controller 210. Memory controller 210 could be implemented with more or fewer functional components than shown.

Data type identifier 212 enables memory controller 210 to identify data type associated with a memory access transaction. In one embodiment, a processor requesting a memory access knows what data type it is requesting. Thus, the processor may indicate in the request, or in a signal or indication associated with the request, the data type associated with the memory access request. Based on the type of data, memory controller 210 may determine to enable or disable error detection.

It may be that determining whether to enable or disable error detection based on data type of the associated memory access request would be the most common or make the most sense. However, it is possible that other factors may be used in making the determination of whether or not to use error detection, such as based on memory access traffic, or based on memory location. For example, error detection may be used unless traffic increases to a certain level where the bandwidth overhead associated with the error detection competes with bandwidth associated with memory access. As another example, error detection may be used for memory access to certain memory locations, but not with others.

CRC enable detection 214 represents any factor other than data type that may be used in determining whether to apply error detection or not. Thus, CRC enable detection 214 enables memory controller 210 to assess factors related to whether or not to apply error detection.

Dynamic CRC enable generator 216 enables memory controller 210 to generate a signal that indicates whether error detection is to be used or not for a specific memory access transaction. In one embodiment, generating a signal is performed by generating a signal that is appended to a memory access command. In one embodiment, generating the signal is performed by setting a bit within a memory access command, as discussed above.

Thus, memory controller 210, via dynamic CRC enable generator functionality 216 provides the capability to generate a command inline with a memory access command, for example, a CAS command. In one embodiment, not all bits of a CAS command are necessary for implementing a CAS command; thus, one or more bits of a CAS command could be set to indicate whether error detection will be applied.

Clock 202 represents a clock signal to apply to memory 220 and memory controller 210 for memory access commands. Clock 202 may be a main system clock (e.g., a clock used to control a processor), a peripheral clock, or some modified (e.g., scaled down) version of some such clock. It is also possible to implement a clock device specifically for memory access. Issued commands and state changes in memory 220 typically occur in reference to clock 202.

Figure 3:
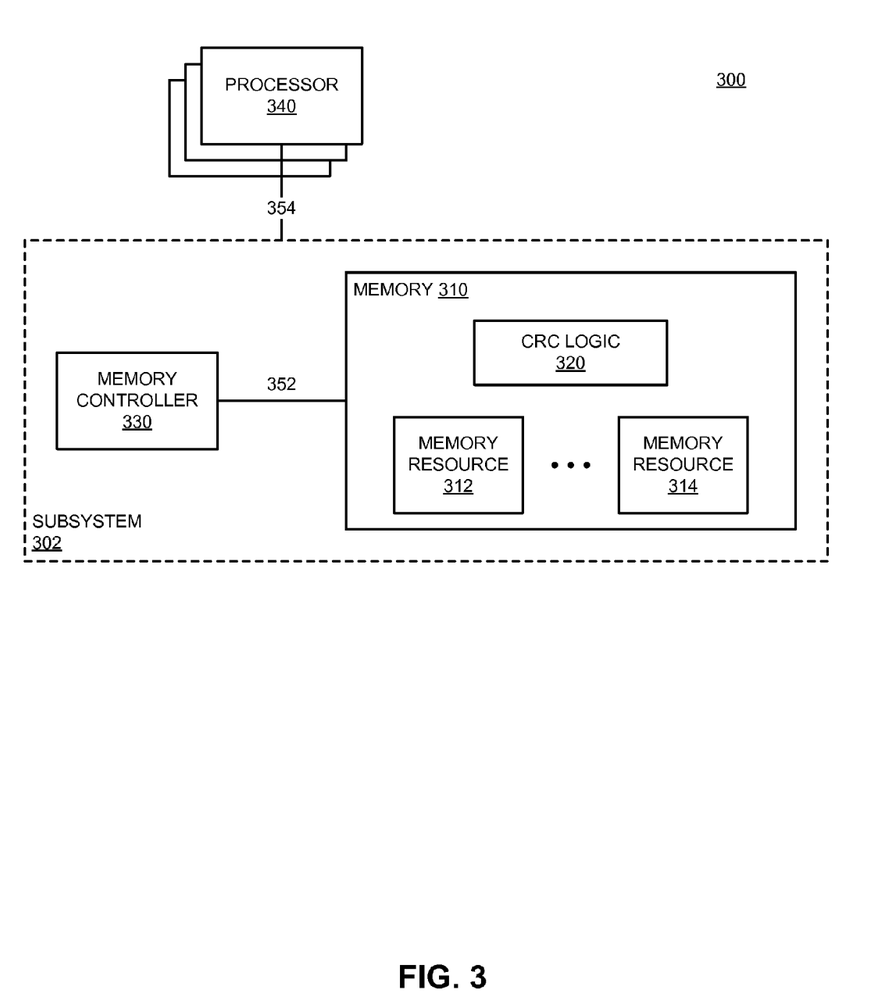
FIG. 3 is a block diagram of an embodiment of a system having a memory device with on the fly memory access error detection.

FIG. 3 is a block diagram of an embodiment of a system having a memory device with on the fly memory access error detection. Any of a variety of computing devices may include a memory device with on the fly dynamic changing of error detection as described herein. System 300 represents any of a number of computing devices that may include. Such computing devices may include servers, desktops, laptops, mobile devices, smartphones, gaming devices, and other devices that have memory that needs to be periodically refreshed.

System 300 includes memory subsystem 302 that includes memory 310. Memory 310 is a memory device according to any embodiment described herein and includes one or more memory resources 312-314. Memory resources 312-314 represent the resources on which the data is stored for memory 310. In one embodiment, the memory resources are separate memory channels, memory banks, memory groups, or other similar separation. The logic required to implement any separate beyond that of memory channels may prevent any separation greater than separate channels in many practical implementations.

Memory 310 further includes CRC logic 320, which represents hardware and/or software logic within memory 310 to implement CRC mode selection in response to commands from memory controller 330. CRC logic 320 includes logic within memory 310 to enable the memory to generate and return an error detection value on a read command, and to decode an error detection value on a write command.

Memory subsystem 302 includes memory controller 330 includes standard logic (hardware and/or software) to control access to memory 310 as is understood in the art. Additionally, memory controller 330 includes logic to determine and implement error detection mode selection in system 300, as discussed above. Thus, the memory controller includes logic to dynamically switch error detection on and off for memory access transactions. Memory controller 330 is associated with memory 310 because it controls the access of memory 310. Memory controller 330 is shown connected to memory 310 via channel 352, which could be a single line channel, or a multi-line channel (e.g., a bus), or a combination.

Processor 340 represents one or more processing resources of system 300. It will be understood that processor 340 may include one or more processor devices, such as or including multi-core devices. Processor 340 accesses memory 310 over bus 354 to perform read and write operations. In one embodiment, processor 340 indicates data type in memory access requests.

Figure 4A:
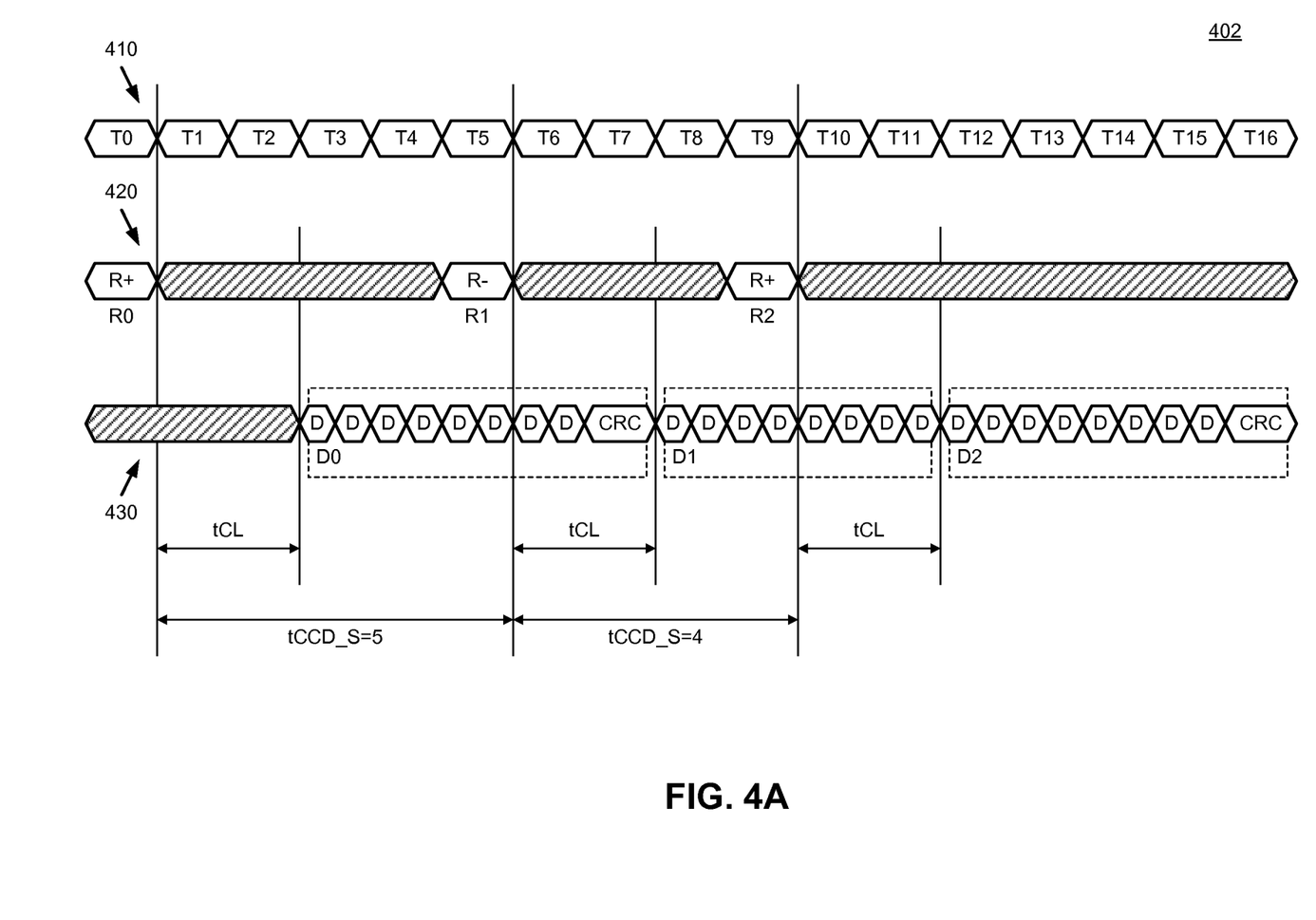
FIGS. 4A-4B are timing diagrams of an embodiment of a system with on the fly CRC mode.
Figure 4B:
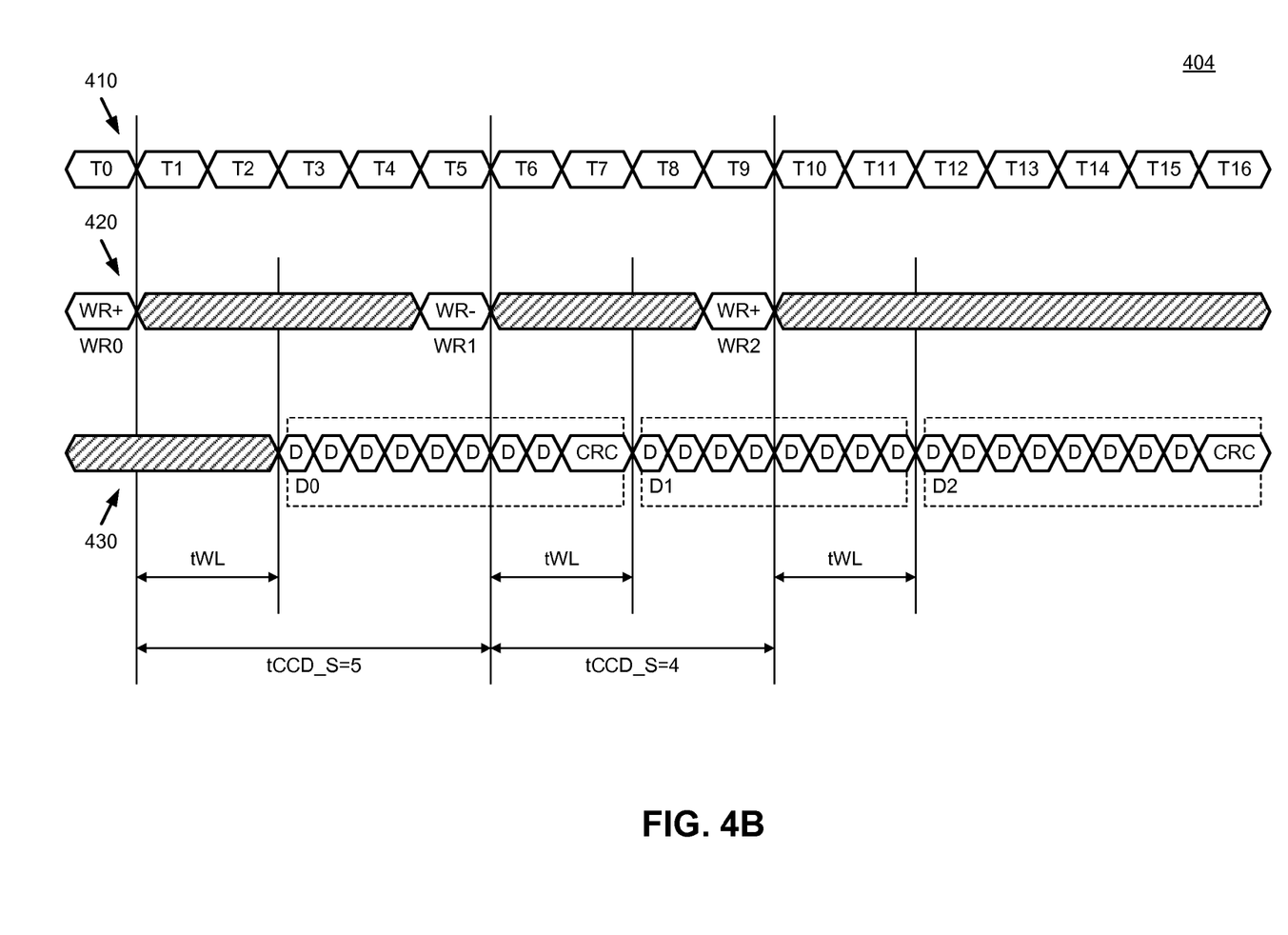

FIGS. 4A-4B are timing diagrams of an embodiment of a system with on the fly CRC mode. CRC on the fly (or error detection on the fly) can be used to get better performance for transactions that do not need CRC. As graphics features are integrated into system processors, the value of differentiating memory access based on data type, and selectively enabling CRC is further enhanced. Thus, the memory controller can selectively enable a cyclic redundancy check in a memory device access operation on a transaction basis. Different CRC states (e.g., on or off) can be enabled on back-to-back memory device access commands, and can be enabled without using a mode register, as illustrated in diagrams 402 and 404 of FIGS. 4A and 4B, respectively.

Referring to FIG. 4A, diagram 402 shows back-to-back reads with 'CRC on the fly' mode enabled. For example, on the fly mode may be enabled in a mode register that then enables the memory controller to selectively use CRC in different transactions. As before with FIG. 1, back-to-back reads to different bank groups are assumed to take 5 clock cycles when a read is issued with CRC (tCCD_S=5). However, back-to-back reads are assumed to take 4 clock cycles when a read command is issued with no CRC (tCCD_S=4). Thus, read with CRC (represented as R+ in diagram 402) takes 5 clock cycles or 10 UI, and read without CRC (represented as R− in diagram 402) takes 4 clock cycles or 8 UI. It will be observed that the CRC signal occupies 2 UI for each data transfer.

In diagram 402, clock signal 410 provides a timing reference for the occurrence of the various activities. There are seventeen active clock cycles shown, T0-T16. Command line 420 illustrates when read commands occur in the example. The discussion of diagram 402 is only made in reference to the read commands, thus, except for the read commands the rest of the command signal is filled with "Don't Care" hash marking.

Three back-to-back reads are shown, R0, R1, and R2. There is a delay of tCL (CAS latency delay) between the issuance of the read command, and the start of the transfer of data (D) on data signal 430, whether for a read with CRC (R+, reads R0 and R2) or a read without CRC (R−, read R1). For purposes of illustration, data transfers D0, D1, and D2 are blocked in dashed lines to show what part of data signal 430 corresponds with which command (R0, R1, and R2 respectively).

Because CRC can be enabled on the fly, it can be seen that R0 takes 5 clock cycles, R1 takes 4 clock cycles, and then R2 takes 5 clock cycles. Thus, back-to-back commands take different numbers of clock cycles, which is a result that could not occur if CRC mode were controlled by mode register alone.

Referring now to FIG. 4B, diagram 404 illustrates back-to-back writes whereas diagram 402 illustrates back-to-back reads. As with back-to-back reads, error detection can be enabled transaction by transaction for write transactions. Write operation WR0 is a write with CRC (WR+), WR1 is a write without CRC (WR−), and WR2 is a write with CRC (WR+). Similarly to the case of read commands, a write with CRC enabled takes 5 clock cycles, and a write without CRC enabled takes 4 clock cycles. As illustrated, the CAS latency delay (tCL) for the read case is replaced with write latency delay time (tWL) for the case of writes.

Figure 5:
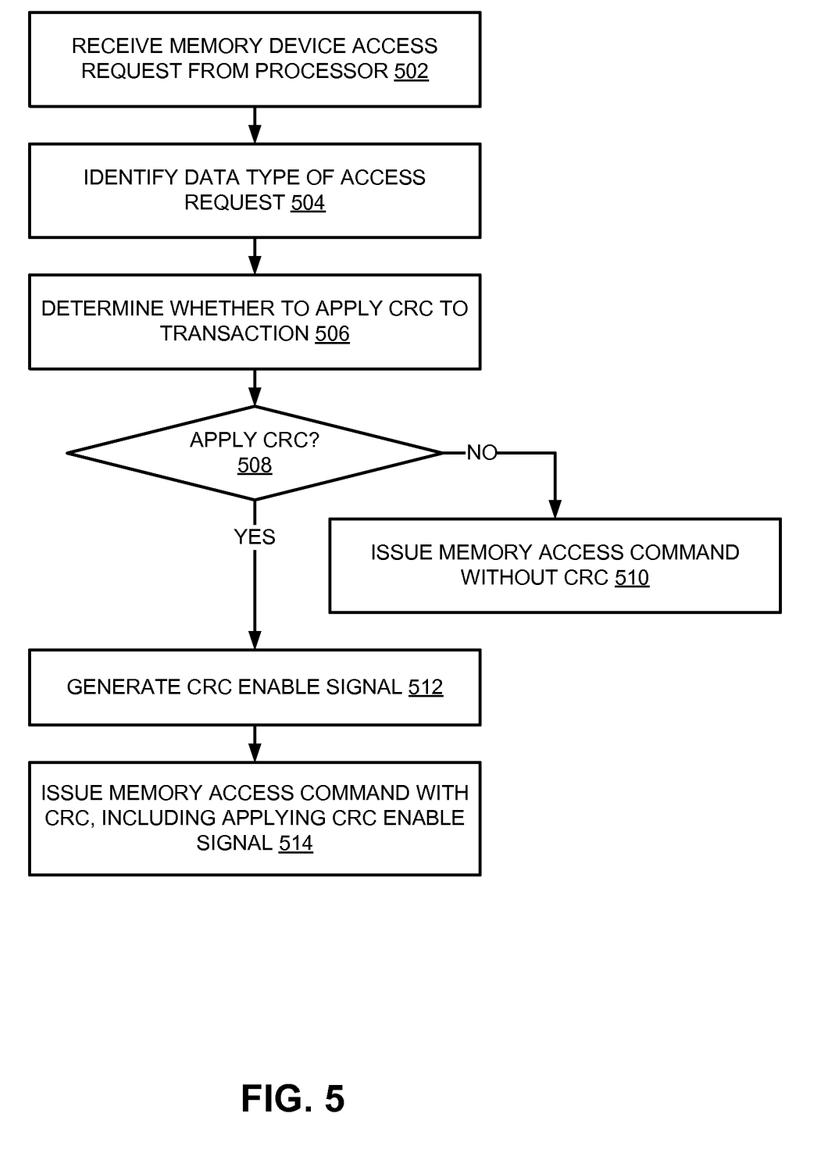
FIG. 5 is a flow diagram of an embodiment of a process for dynamically enabling and disabling memory access error detection.

FIG. 5 is a flow diagram of an embodiment of a process for dynamically enabling and disabling memory access error detection. Flow diagrams as illustrated herein provide examples of sequences of various process actions. Although shown in a particular sequence or order, unless otherwise specified, the order of the actions can be modified. Thus, the illustrated implementations should be understood only as an example, and the process can be performed in a different order, and some actions may be performed in parallel. Additionally, one or more actions can be omitted in various embodiments of the invention; thus, not all actions are required in every implementation. Other process flows are possible.

When a processor needs to execute operations, it performs operations on data stored in memory. The operations may include read and/or write of data in memory. When a processor needs data, it generates a memory device access request. The memory control logic or memory controller receives the access request from the processor, 502. In one embodiment, the controller identifies the data type of the access request, 504. Identification can occur by reading an indication provided by the processor.

The controller may determine if CRC is available in the system. The capability of using CRC is set via mode register in a system. If CRC is available in the system, the controller determines whether to apply CRC to the memory access transaction, 506. The determination of whether to apply error detection is discussed above.

If the controller determines not to apply CRC, 508, the controller issues the memory access command without CRC, 510. If the controller determines to apply CRC, 508, the controller generates a CRC enable signal, 512. In one embodiment, the enable signal is integrated inline with the memory access command. The controller then issues the memory access command with CRC, including applying the CRC enable signal, 514.

Various operations or functions are described herein, which may be described or defined as software code, instructions, configuration, and/or data. The content may be directly executable ("object" or "executable" form), source code, or difference code ("delta" or "patch" code). The software content of the embodiments described herein may be provided via an article of manufacture with the content stored thereon, or via a method of operating a communications interface to send data via the communications interface. A machine readable medium or computer readable medium may cause a machine to perform the functions or operations described, and includes any mechanism that provides (i.e., stores and/or transmits) information in a form accessible by a machine (e.g., computing device, electronic system, or other device), such as via recordable/non-recordable storage media (e.g., read only memory (ROM), random access memory (RAM), magnetic disk storage media, optical storage media, flash memory devices, or other storage media) or via transmission media (e.g., optical, digital, electrical, acoustic signals or other propagated signal). A communication interface includes any mechanism that interfaces to any of a hardwired, wireless, optical, or other medium to communicate to another device, such as a memory bus interface, a processor bus interface, an Internet connection, a disk controller. The communication interface can be configured by providing configuration parameters and/or sending signals to prepare the communication interface to provide a data signal describing the software content.

Various components described herein may be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications may be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A method comprising:
   receiving a memory access command to implement a memory access transaction by a memory device from a memory controller, the memory access command including an inline error detection indicator generated by the memory controller, including one or more signal bits that specify within the memory access command whether to apply error detection for the memory access transaction;
   determining whether to apply error detection for the memory access transaction based on the inline command where a separate determination is made for adjacent memory access transactions, the memory access transaction including a read operation or a write operation in response to a read command or a write command, respectively; and
   selectively enabling error detection in the memory access transaction on a transaction basis based on the determination, where applying error detection adds data transfer overhead to the memory access transaction to provide an error check value.

2. The method of claim 1, wherein enabling error detection comprises enabling cyclic redundancy checking (CRC) through the use of a checksum value included in the memory access transaction data.

3. The method of claim 1, wherein enabling error detection on a transaction basis comprises enabling selection of different error detection states on back-to-back memory device access commands.

4. The method of claim 1, wherein enabling error detection on a transaction basis comprises enabling selection of different error detection states without using a mode register.

5. The method of claim 1, wherein enabling error detection on a transaction basis comprises sending an error detection enable command inline with a column access select (CAS) command.

6. The method of claim 5, wherein sending the error detection enable command inline with the CAS command comprises setting bits within the CAS command to selectively switch error detection on or off.

7. The method of claim 1, wherein error detection is selectively enabled based on a data type of a request for the memory access transaction.

8. The method of claim 7, wherein error detection is enabled for memory access transactions relating to system data or critical application data.

9. An apparatus comprising:
   memory resources to store data; and
   memory resource control logic coupled to the memory resources, the control logic to
      receive a memory access command to implement a memory access transaction by a memory device from a memory controller, the memory access command including an inline error detection indicator generated by the memory controller, including one or more signal bits that specify within the memory access command whether to apply error detection for the memory access transaction;
      determine whether to apply error detection for the memory access transaction based on the inline command where a separate determination is made for adjacent memory access transactions, the memory access transaction including a read operation or a write operation in response to a read command or a write command, respectively; and
      selectively enable error detection in the memory access transaction on a transaction basis based on the determination, where applying error detection adds data transfer overhead to the memory access transaction to provide an error check value.

10. The apparatus of claim 9, wherein the memory resource control logic is to enable error detection by enabling cyclic redundancy checking (CRC) through the use of a checksum value included in the memory access transaction data.

11. The apparatus of claim 9, wherein the memory resource control logic is to enable error detection on a transaction basis by enabling selection of different error detection states on back-to-back memory device access commands.

12. The apparatus of claim 9, wherein the memory resource control logic is to enable error detection on a transaction basis by enabling selection of different error detection states without using a mode register.

13. The apparatus of claim 9, wherein the memory resource control logic is to enable error detection on a transaction basis by sending an error detection enable command inline with a column access select (CAS) command.

14. The apparatus of claim 13, wherein the memory resource control logic is to send the error detection enable command inline with the CAS command by setting bits within the CAS command to selectively switch error detection on or off.

15. The apparatus of claim 9, wherein error detection is selectively enabled based on a data type of a request for the memory access transaction.

16. The apparatus of claim 15, wherein error detection is enabled for memory access transactions relating to system data or critical application data.

17. A system comprising:
   a memory device having
      memory resources to store data; and
      memory resource control logic coupled to the memory resources, the control logic to receive a memory access command to implement a memory access transaction by a memory device from a memory controller, the memory access command including an inline error detection indicator generated by the memory controller, including one or more signal bits that specify within the memory access command whether to apply error detection for the memory access transaction; determine whether to apply error detection for the memory access transaction based on the inline command where a separate determination is made for adjacent memory access transactions, the memory access transaction including a read operation or a write operation in response to a read command or a write command, respectively; and selectively enable error detection in the memory access transaction on a transaction basis based on the determination, where applying error detection adds data transfer overhead to the memory access transaction to provide an error check value; and
   a multi-core processor coupled to the memory device to generate memory access requests for data stored on the memory device.

18. The system of claim 17, wherein the memory resource control logic is to enable error detection by enabling cyclic redundancy checking (CRC) through the use of a checksum value included in the memory access transaction data.

19. The system of claim 17, wherein the memory resource control logic is to enable error detection on a transaction basis by enabling selection of different error detection states on back-to-back memory device access commands.

20. The system of claim 17, wherein the memory resource control logic is to enable error detection on a transaction basis by enabling selection of different error detection states without using a mode register.

21. The system of claim 17, wherein the memory resource control logic is to enable error detection on a transaction basis by sending an error detection enable command inline with a column access select (CAS) command.

22. The system of claim 21, wherein the memory resource control logic is to send the error detection enable command inline with the CAS command by setting bits within the CAS command to selectively switch error detection on or off.

23. The system of claim 17, wherein error detection is selectively enabled based on a data type of a request from the multi-core processor.

24. The system of claim 23, wherein error detection is enabled for memory access transactions relating to system data or critical application data.

25. A method comprising:
   receiving a memory access command to implement a memory access transaction by a memory device from a memory controller, the memory access command including an inline error detection indicator generated by the memory controller, including one or more signal bits that specify within the memory access command whether to apply error detection for the memory access transaction;
   determining, during active operation of a memory device, whether to apply cyclic redundancy checking (CRC) to the memory access transaction based on the inline command where a separate determination is made for adjacent memory access transactions, the determination made on a transaction by transaction basis, the memory access transaction including a read operation or a write operation in response to a read command or a write command, respectively; and
   selectively enabling CRC for the memory access transaction based on the determination by applying a setting to a mode register that controls a CRC mode for the memory device.

26. The method of claim 25, wherein selectively enabling CRC comprises enabling CRC for a series of transactions.

27. The method of claim 25, wherein selectively enabling CRC comprises selectively enabling CRC based on an amount of traffic to the memory device.

* * * * *